United States Patent [19]

Brown, Sr. et al.

[11] Patent Number: 5,131,044

[45] Date of Patent: Jul. 14, 1992

[54] AMPLIFIER CIRCUITRY WITH MODE COMPENSATION AND SELECTABLE GAIN AND FREQUENCY RESPONSE IN PRE AND POST DISTORTION CIRCUITS

[75] Inventors: James W. Brown, Sr.; Jack C. Sondermeyer, both of Meridian, Miss.

[73] Assignee: Peavey Electronics Corporation, Meridian, Miss.

[21] Appl. No.: 537,993

[22] Filed: Jun. 13, 1990

[51] Int. Cl.$^5$ .............................................. H03G 3/00
[52] U.S. Cl. ......................................... 381/61; 84/692; 84/735
[58] Field of Search ..................... 381/61, 98; 84/692, 84/735

[56] References Cited

U.S. PATENT DOCUMENTS

| | | |
|---|---|---|
| 2,492,542 | 12/1949 | Stone . |
| 3,059,190 | 10/1962 | Hafler . |
| 3,449,681 | 6/1969 | Hafler . |
| 3,767,834 | 10/1973 | Hebeisen et al. . |
| 3,860,876 | 1/1975 | Woods . |
| 3,946,328 | 3/1976 | Boctor . |
| 4,002,994 | 1/1977 | Fender . |
| 4,078,215 | 3/1978 | Vinson . |
| 4,107,622 | 8/1978 | Toyomaki . |
| 4,151,477 | 4/1979 | Yokoyama . |
| 4,180,707 | 12/1979 | Moog . |
| 4,206,417 | 6/1980 | Poulo . |
| 4,211,893 | 7/1980 | Smith . |
| 4,220,817 | 9/1980 | Kampmann . |
| 4,262,260 | 4/1981 | Tamura . |
| 4,290,335 | 9/1981 | Sondermeyer . |
| 4,318,053 | 3/1982 | Sondermeyer . |
| 4,349,788 | 9/1982 | Sondermeyer . |
| 4,405,832 | 9/1983 | Sondermeyer . |
| 4,495,640 | 1/1985 | Frey ....................... 381/61 |
| 4,581,587 | 4/1986 | Powell . |
| 4,633,189 | 12/1986 | Kawakami et al. . |
| 4,701,957 | 10/1987 | Smith . |
| 4,752,960 | 6/1988 | Scholz ..................... 381/61 |
| 4,811,401 | 3/1989 | Brown Sr. et al. . |
| 4,890,331 | 12/1989 | Brown, Sr. et al. . |

FOREIGN PATENT DOCUMENTS 0111066 6/1984 European Pat. Off. .

Primary Examiner—Forester W. Isen
Attorney, Agent, or Firm—Watson, Cole, Grindle & Watson

[57] ABSTRACT

The present invention employs gain compensation such that when the amplifier is in the clean mode, the gain is at a selected level and when the amplifier is in the lead mode gain is decreased. In one embodiment a selectable brightness control is employed to raise the high frequency response in the clean mode. In another embodiment, a selectable gain boost control is employed to increase the gain in the lead mode. At least one frequency selectable means is provided in a post distortion stage output circuit for varying the frequency response of the output in the lead mode.

36 Claims, 5 Drawing Sheets

AMPLIFIER CIRCUITRY WITH MODE COMPENSATION AND SELECTABLE GAIN AND FREQUENCY RESPONSE IN PRE AND POST DISTORTION CIRCUITS

BACKGROUND OF THE INVENTION

This invention is directed to audio amplifier circuitry, and particular to such circuitry for selectively varying the gain and frequency response in various stages of amplification.

The invention is related to Brown, Sr. et al., U.S. Pat. No. 4,811,401 entitled "Superdistorted Amplifier Circuitry With Normal Gain" and commonly assigned to the assignee herein. The subject matter of the aboveidentified patent is incorporated herein by reference. Brown, Sr. et al. describes an audio frequency amplifier which is selectively operable in a clean (undistorted) mode and a lead (distorted) mode. In the clean mode, a switch completes a ground circuit in the undistorted amplifier stage while the distortion amplifier stage is allowed to float at unity gain and vice versa.

The amplifying circuitry of the aforementioned U.S. patent is used for amplifying musical instruments, particularly electric guitars. Various controls are provided to select the desired mode of operation. The circuitry may be further improved by employing selectable pre and post distortion stage gain and frequency response compensation. In some cases compensation depends upon the mode of operation. For example, i& is desirable to automatically compensate for certain mode changes between clean and lead modes, because without such compensation the musical performance may be adversely affected. Automatic compensation, however necessary, places some limits on the musician's ability to control the available frequency response of the circuitry and hence the ultimate sound. Accordingly, it is desirable to allow the artist to retain a full measure of control in those areas where undesirable effects are unlikely.

SUMMARY OF THE INVENTION

The present invention employs gain compensation such that when the amplifier is in the clean mode, the gain is at a selected level and when the amplifier is in the lead mode gain is increased. In one embodiment, a selectable brightness control is employed to raise the high frequency response in the clean mode. In another embodiment, a selectable gain boost control is employed to increase the gain in the lead mode. At least one frequency selectable means is provided in a post distortion stage output circuit for varying the frequency response of the output in the lead mode.

DESCRIPTION OF THE INVENTION

Figure 1:
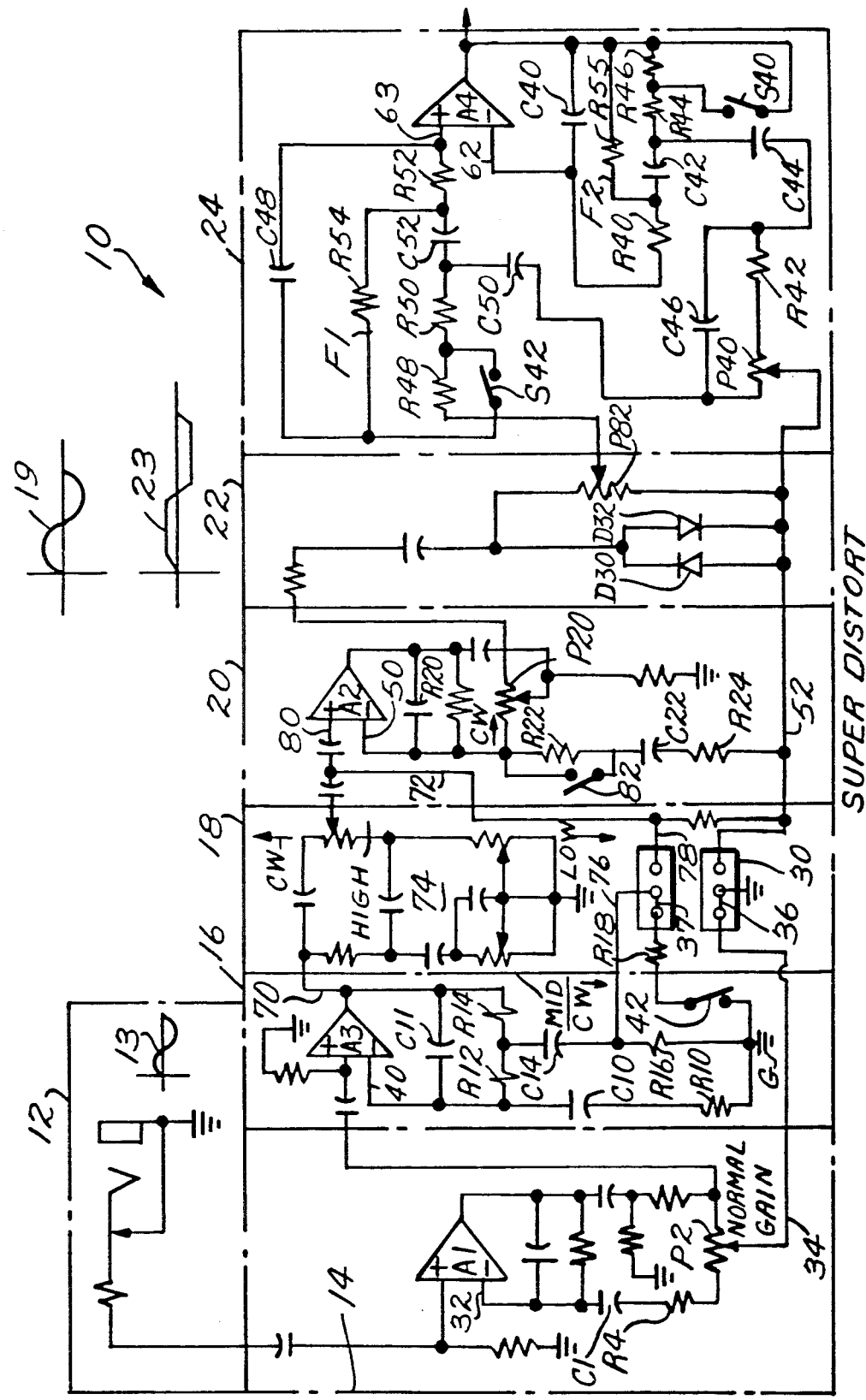
FIG. 1 is a schematic diagram of an exemplary embodiment the invention employing amplification circuits for clean and lead mode with gain compensation and selectable frequency and gain control circuits in pre and post distortion stages.

An exemplary of a multistage, multimode amplifier circuit 10 of the present invention is illustrated in FIG. 1. The amplifier circuit 10 is capable of operating alternatively in a clean mode which is characterized by high gain with little or no distortion and in a lead mode which is characterized by high gain and high distortion. The embodiment illustrated employs an input stage 12 for receiving an input signal 13 and a preamplifier stage 14 responsive to the input stage 12 for providing clean, broad band input amplification. A selectable intermediate amplifier stage 16 provides additional broad band amplification and selective high frequency adjustment or brightness in the clean mode. A bypassable tone control filter stage 18 is operatively coupled to the output of the intermediate amplifier stage 16 in the clean mode to selectively vary respective high, low and intermediate frequency ranges of the undistorted or clean output signal 19. In the lead mode, the tone control filter stage 18 is bypassed.

A selectable distortion amplifier stage 20 is responsive in the lead mode to amplify inputs from the preamplifier and intermediate stages 12 and 14. Distortion stage 22 is likewise responsive in the lead mode to superdistortion amplifier stage 20 to introduce a desirable distortion characteristic to thereby produce distorted output signal 23.

One or more output circuits may be preferably employed to in the lead mode further enhance the distorted output signal 23. For example, a combined active body and shift circuit 24 is provided to actively vary, i.e., boost and cut, the gain of the distorted output signal 23 thereby adding body to the signal and to shift the frequency response of the gain between selected center frequencies.

Figure 2:
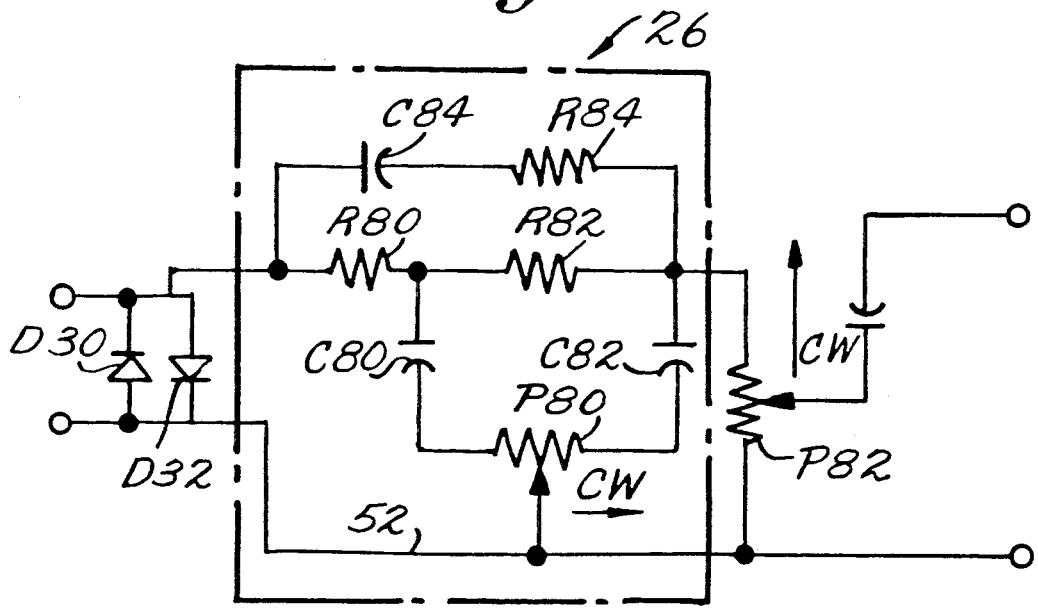
FIG. 2 is a schematic diagram of an alternative embodiment employing a passive filter for frequency control.

FIG. 2 illustrates a passive body circuit 26 which may be used to reduce or cut the frequency of the distorted signal 23 in a manner similar to the combined circuit 24 of FIG. 1. In the arrangement, boost is not employed nor is a shift function. The passive nature of the circuit results in reduced cost however.

Figure 3:
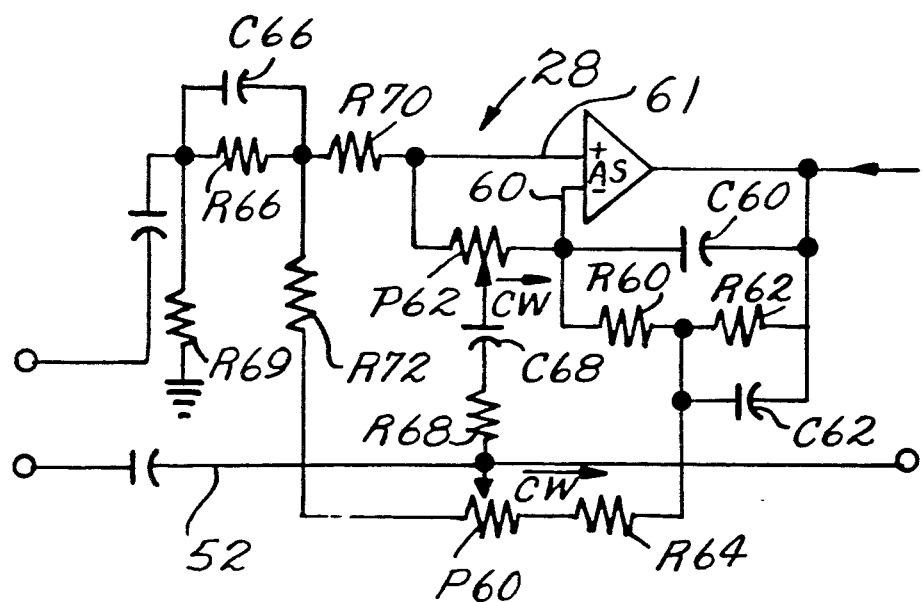
FIG. 3 is a schematic diagram of an active circuit for modifying low, and high frequency response in a post distortion configuration.

FIG. 3 illustrates an edge and bottom control 28 in which low and high frequency roll off, i.e., attenuation of the distorted signal 23 may be varied. At the low end (bottom) gain may be selectively increased or boosted as the frequency response is varied. Similarly, at the high end (edge) gain may be boosted near the upper limit of frequency response.

Mode control selection between the clean and lead modes is achieved by means of mode control switch 30. In the arrangement as illustrated herein and described in considerable detail in Brown, Sr., et al. mode control switch 30 selectively opens the ground circuit for various operational amplifiers employed in certain ones of the amplifier stages. In particular, the mode switch 30 is designed to open the ground circuit for the preamplifier stage 14 while at the same time closing the ground circuit for the distortion amplifier stage 20 and vice versa.

Normally, the gain of an operational amplifier employing negative feedback is determined by the ratio of the feedback resistance between the output and the inverted input and the resistance from the inverted input to ground. The gain characteristic is generally defined as:

$$G_a = \frac{R_f}{R_g} + 1$$

where $R_f$ is the feedback resistance and $R_g$ is the resistance to ground of the inverted input. When the ground circuit is open the ground resistance becomes sufficiently high such that the gain of the operational amplifier floats to 1. When a ground resistor is employed, the gain of the operational amplifier is thereby increased by the ratio $R_f/R_g$.

In FIG. 1 amplifier A1 of preamplifier stage 14 has its inverted input 32 coupled to ground G via series capacitor C1, resistor R4 and potentiometer P2. The circuit is coupled to ground G by lead wire 34 and mode switch 30 when switch contact 36 is in the left hand or clean position.

In intermediate amplifier stage 16, operational amplifier A3 has its inverted input 40 coupled to ground G via capacitor C10 in series with resistor R10. A parallel branch extending from the inverted input 40 across capacitor C10 and resistor R10 includes resistor R12 in series with capacitor C14 and resistor R16 as illustrated. A further parallel branch shunting resistor R16 includes the movable contact 37 of mode switch 30 in series with resistor R18 and brightness switch 42 to ground G.

Operational amplifier A2 employed in the distortion amplifier stage 20 has its inverted input 50 coupled to ground G via a series circuit including resistor R22, capacitor C22, resistor R24, and lead wire 52 to ground when mode switch contact 36 is in the right hand or lead position. When movable contact 36 is in the left hand position the ground circuit for amplifier A1 is completed and the ground circuit for amplifier A2 is open. Accordingly, at any time, depending upon the position of the mode switch 30, one of the amplifiers A1 and A2 produce an amplified output while the other floats at unity gain.

The distortion stage 22, the combined active body and shift circuit 24 as well as the passive body circuit 26 (FIG. 2) and edge and bottom circuit 28 (FIG. 3) may likewise be controlled by the position of the mode switch 30. In the arrangement illustrated, each has its respective ground circuit completed when the mode switch 30 is in the right hand or lead position. Accordingly, the circuits are only operative to significantly modify the distorted output 23 when the amplifier 10 is in the lead mode.

The ground circuit for the distortion stage 22 includes antiparallel connected diodes D30 and D32 which are coupled to ground G via lead wire 52 and appropriately positioned contact 36. The ground circuit for the passive body circuit 26 (FIG. 2) includes the wiper of potentiometer P80 connected in series with lead wire 52 and parallel connected capacitors C80 and C82.

The ground circuit for amplifier A5 of edge and bottom circuit 28 (FIG. 3) extends from the inverted input 60 to a series circuit including resistor R60, resistor R64 and potentiometer P60 to the lead wire 52 and switch contact 36. A parallel branch to ground G extends from inverted input 60 via series connected potentiometer P62, capacitor C68 and resistor R68 to the lead wire 52 as illustrated.

The ground circuit for the combined active body and shift circuit 24 (FIG. 1) extends from the inverted input 62 of amplifier A4 to a series circuit including resistor R40, capacitor C42, capacitor C44 and a parallel connected circuit including series resistor R42 and potentiometer P40 in parallel with shunt capacitor C46 to the lead wire 52 and switch contact 36.

In FIG. 1, amplifier A3, in addition to providing the intermediate amplification function, also provides in the clean mode a selectable brightness function. Amplifier A3 has a pair of series connected feedback resistors R12 and R14 in parallel with feedback capacitor C11 coupled between its output node 70 and the inverted input 40. The ground circuit for amplifier A3 has been referred to above.

Amplifier A3 operates as follows: when the mode switch 30 is to the left, in the clean position, and when switch 42 is open circuit, the gain function of the amplifier A3 is generally established by the sum of the feedback resistance R12 and R14 divided by the ground resistance R10.

Figure 4A:
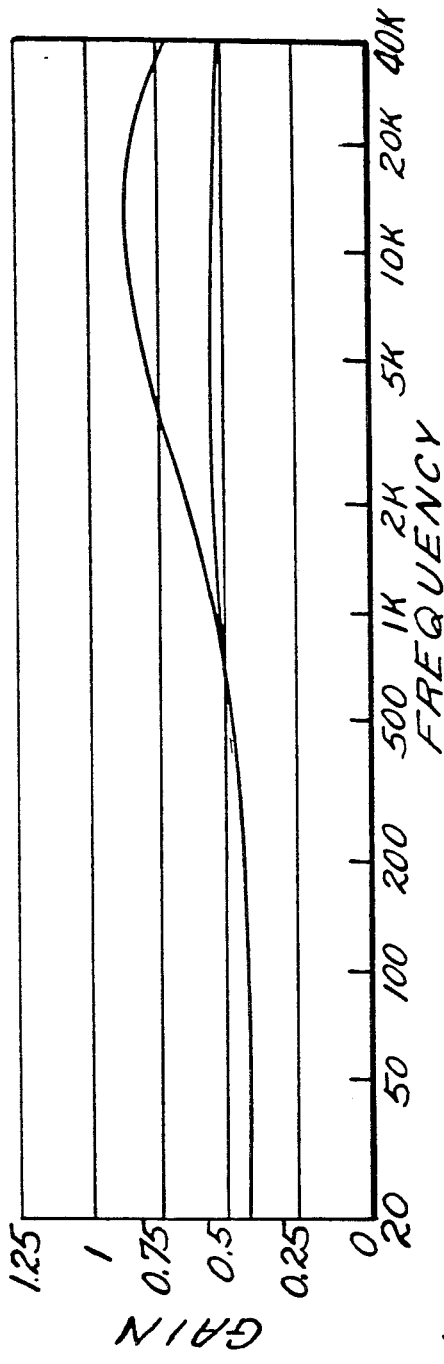
FIGS. 4A–4F are frequency response curves for circuits illustrated in FIGS. 1-3.

When switch 42 is open circuit, the low frequency response of the amplifier A3 is established at a nominal value by the combined reactive impedance of capacitors C10, C14 and resistors R10, R16. In the arrangement, resistor R10 has a lower resistance compared to resistor R16 by a factor of about 5. Accordingly, the effect of capacitor C10 and resistor R10 on the low cut off frequency predominate. Resistor R18 has a value which is about 10% of R16 and about one half of resistor R10. When the switch 42 is closed and resistor R18 is placed in parallel with resistors R16 and R10, the effective resistance decreases which thereby increases the effect of capacitor C14 on the frequency response of the circuit. Therefore, the frequency response of the amplifier A3 is boosted in the high frequency range by the insertion of resistor R18. See FIG. 4A for the plot of gain versus frequency for the brightness function. In the present invention, the brightness function described results in an increase in the high frequency response of amplifier A3.

Referring again to FIG. 1, the output 70 of amplifier A3 is coupled in circuit with the distortion amplifier stage 20 in two ways. When the mode switch 30 is positioned in the clean mode, the output 70 of amplifier A3 is coupled to amplifier A2 via tone control filter 74. When the mode switch 30 is moved to the lead mode, the output 70 of the amplifier A3 is coupled to amplifier A2 via resistor R14, capacitor C14, lead wire 76 coupled to the node between capacitor C14 and resistor R16, switch contact 37, lead 78 and input lead 72 to the noninverted input 80 of amplifier A2. The combination of capacitor C14 and resistor R16 creates a high pass filter which rolls off low frequency when in the lead mode.

When the switch 30 is positioned in the lead mode, with the contact 36 in the right hand position, the feedback circuit of amplifier A3 is automatically changed such that the gain of the amplifier A3 is diminished. This occurs first, because resistor R14 is removed from the feedback circuit of A3 and inserted in the output circuit by virtue of the direct connection of the node between resistors R12 and R14 to the input circuit of amplifier A2. Such an arrangement allows amplifier A3 to operate in a broad band fashion but at a slightly reduced gain. The lower broad band gain of amplifier A3 followed by the low frequency roll off of capacitor C14 and resistor R16, as input to the distortion amplifier stage 20 results in improved audio sound.

In addition, when the mode switch 30 is in the lead position, resistor R18 and switch 42 are open circuited and thus no longer have an effect on the gain or frequency response of amplifier A3. In another words, the brightness control is only effective in the clean mode.

The distortion amplifier stage 20 is operative when the mode switch 30 is in the lead position to produce an amplified output signal as an input to the distortion stage 22 which is also enabled by virtue of the completed ground circuit discussed above. The gain of the amplifier A2 is a function of the parallel resistance of feedback resistor R20 and potentiometer P20 divided by the series resistance of the ground circuit including resistors R22 and R24. It should be understood that the gain of the amplifier A2 may be effected by movement of the potentiometer between the extreme clockwise CW (maximum) and counterclockwise (minimum) positions so that the overall feedback resistance is effected.

In addition, switch 82 which is in shunt with resistor R22 affects the ground circuit resistance and thereby affects the gain of the amplifier A2. When the switch 82 is open the total resistance to ground G is the sum of the resistances R22 and R24. When switch 82 is closed the resistor R22 is shunted and the ground resistance decreases thereby increasing the gain of the amplifier A2. Further, resistor R22 has a value about 20 the value of resistor R24. Accordingly, the low frequency response of amplifier A2 changes significantly from a gradual roll off at about 50 hertz when switch 82 is open to a steep roll off at about 800 hertz when switch 82 is closed. This occurs because the time constant of the ground circuit established by resistor R22, capacitor C22 and resistor R24 is decreased when resistor R22, which is large compared to resistor R24, is removed from the circuit.

Figure 4B:
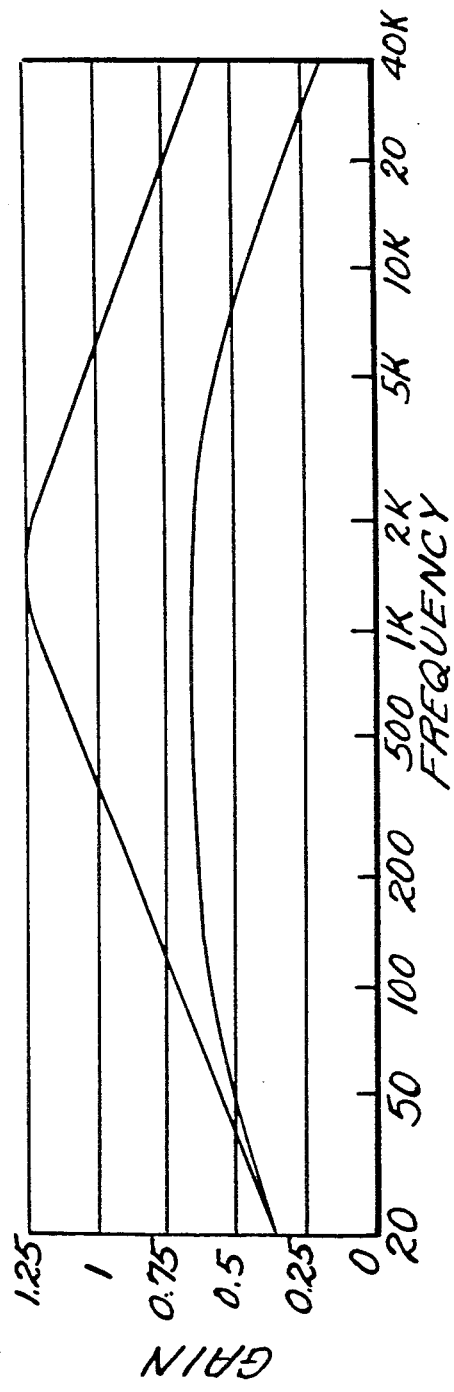

It has been found that, because of the distortion introduced into the circuit 10 by the distortion circuit 22, the combination of an increase in the gain of the distortion amplifier stage 20 should be accompanied by a steep low frequency roll off at a higher frequency. When the gain of an amplifier A2 is reduced the roll off is likewise rendered gradual. The combined effects result in a more pleasing audio sound. In another words, as the gain is increased, low frequency response should be increased and conversely when the gain is decreased a low frequency response should be reduced. It is worthwhile to include more low frequencies when amplifier A2 is operating at a lower gain because the high frequencies tend to be overemphasized at low gain levels. FIG. 4B illustrates the frequency response of the circuit.

The combined active body and shift circuit 24 referred to above and which is illustrated in FIG. 1 employs a pair of modified bridged "T" notch filters F1 and F2 coupled to the respective inverting and noninverting inputs 63 and 62 of amplifier A4. The passive body circuit 26 shown in Fig. 2 also employs a modified bridged "T" notch filter. In a conventional bridged "T" notch filter (not shown) the node of a pair of input and output series resistors is coupled the ground via a capacitor. The resistors are also bridged by a parallel capacitor. The bridging capacitor in combination with the parallel output resistor provide for low frequency roll off, while the capacitor in the ground circuit in combination with the input resistor provide high frequency roll off.

Figure 4C:
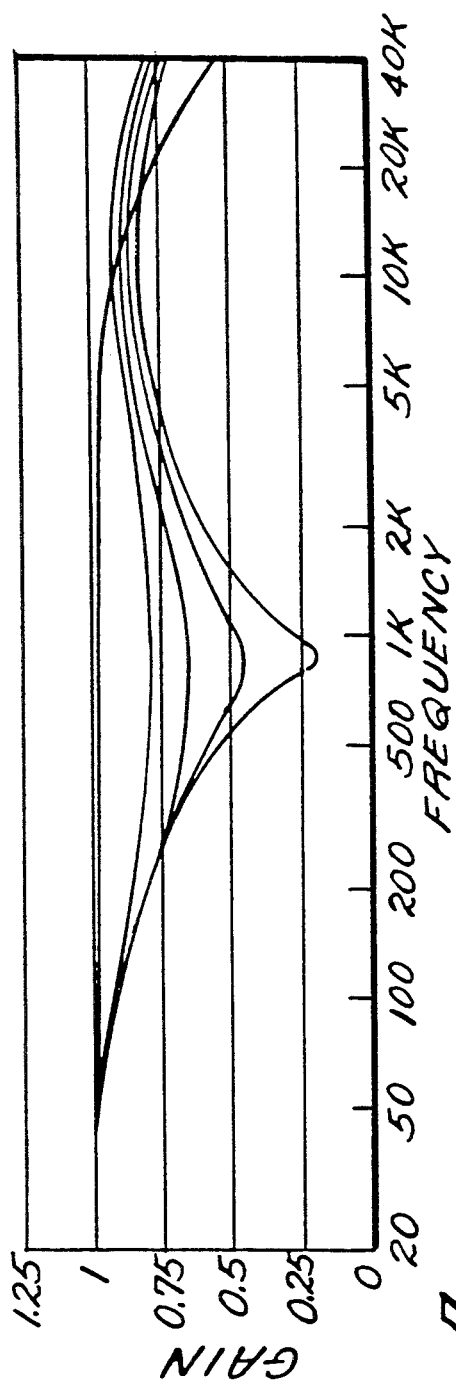

The arrangement of FIG. 2, is first described to illustrate the concept of passive body circuit 26 employing a modified bridged "T" notch filter. In the arrangement, resistor R80 and capacitor C80 generally establish the high frequency roll off response. Resistor R82 and capacitor C84 generally establish the low frequency roll off or attenuation of the circuit. The combination forms a notch filter. Potentiometer P80 in series with capacitor C80 adjusts the gain such that when the potentiometer P80 is in the full counterclockwise position, i.e., to the left, capacitor C80 is grounded and the notch is deep. Likewise when the potentiometer P80 is moved to the full clockwise CW position, to the right, capacitor C80 is essentially floating. Accordingly, the response of the circuit is essentially flat. See for example FIG. 4C which shows attenuation versus frequency of the circuit.

Potentiometer P82, connected to the node between output resistor R82 and capacitor C82, adjusts the circuit gain, i.e., volume. At the full clockwise CW position potentiometer provides maximum output. In the counterclockwise direction, (opposite CW) the potentiometer P80 loads the circuit to reduce its gain. Loading is such that high frequencies are relatively unaffected by potentiometer P82 but low frequencies are diminished. In order to compensate for the reduced low frequency response, resistor R84 in series with capacitor C84 limit the gain of high frequency signals.

Further, when the potentiometer P80 is clockwise allowing a flat response, the capacitor C82 causes the high frequencies to roll off because it shunts potentiometer P82 to ground. However, when potentiometer P80 is in the full counterclockwise position capacitor C82 floats and has no effect on the high frequency response. The resistance values are such that resistor R80 has a high value with respect to resistor R84. Capacitor C80 is likewise high with respect to capacitors C82 and C84. Thus, the combination of capacitor C80 and resistor R80 has an effect on the high frequency response in a broader band than capacitors C82 and C84 which operate at high frequencies.

The arrangement of FIG. 2 does not provide active boost to the signals. In order to achieve boost amplification is required. In such a case the combined circuit 24 of FIG. 1 which employs modified active bridged "T" notch filters F1 and F2 is useful.

Noninverting input 63 of amplifier A4 is connected to filter F1 including a series parallel circuit of series connected resistors R48, R50 and R52 and capacitor C52. Bridging capacitor C48 is in parallel with the aforementioned elements. Capacitor C50 is coupled between the node of resistor R50 and capacitor C52 and the other end of the series parallel circuit including potentiometer P40, resistor R42 and capacitor C46 in the ground circuit. Switch S42 shunts resistor R48. Capacitor C52 has a high value and effectively connects resistors R50 and R52 in parallel with bridging resistor R54.

The amplifier A4 has filter F2 in its feedback circuit including capacitor C40 in parallel with series connected resistors R40, R44 and R46 and capacitor C42. Resistor R46 is shunted by a switch S40. Capacitor C44 is connected to the node between capacitor C42 and resistor R44 in series with one end of the series parallel circuit including capacitor C46 and resistor R42 and potentiometer P40 described above. Capacitor C42 is large and effectively connects resistor R55 in parallel with resistors R44 and R46. In filters F1 and F2, capacitors C52 and C42 eliminate DC transients when switches S42 and S40 are open or closed, but otherwise have no effect on the frequency response in the audio frequency range.

Figure 4D:
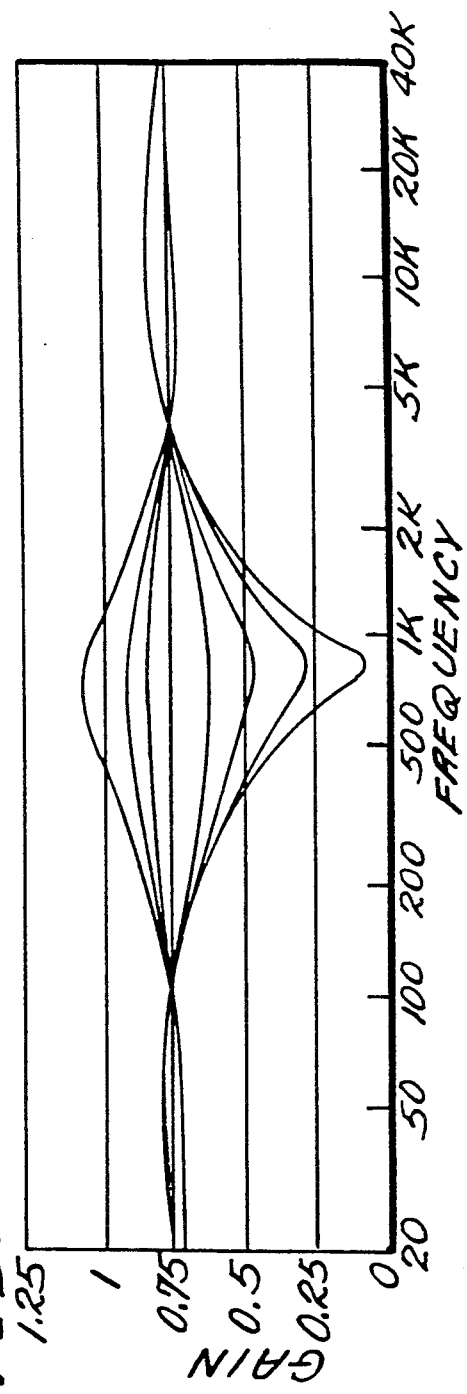

The response of the amplifier A4 to the notch filter F1 at its noninverting input 63 is illustrated in FIG. 4D as an attenuation (cut) at a given center frequency. The response of the amplifier A4 to the notch filter F2 in its feedback circuit to inverting input 62 is an increase in gain or a boost also illustrated in FIG. 4D. The potentiometer P40 which is connected between the inverting and noninverting inputs 62, 63 of amplifier A4 balances the boost or cut. In the clockwise CW position potentiometer P40 reduces the ground resistance and hence allows greater boost from feedback of filter F2 at the center frequency. Resistor R42 in series with potentiometer P40 limits boost. In the opposite position potentiometer P40 allows maximum attenuation (cut) about the center frequency. Capacitor C46 in parallel with potentiometer P40 and resistor R42 linearizes the ground circuit.

Figure 4E:
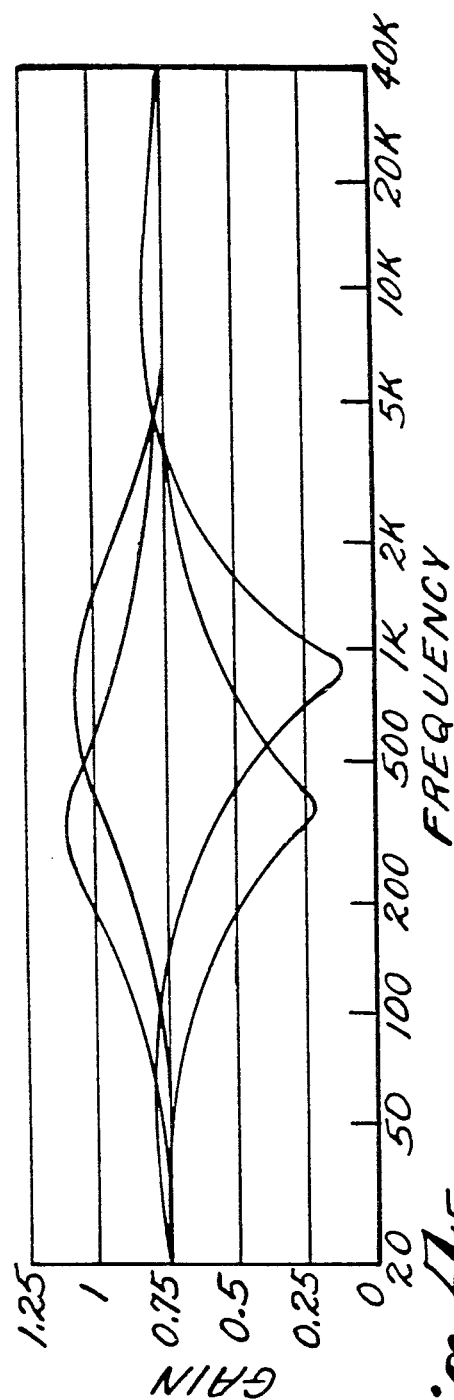

The combined circuit 24 also provides a center frequency shifting function (FIG. 4E). Switches S40 and S42 are preferably ganged together. Accordingly, when switches S40 and S42 are open, respective shunted resistors R48 and R46 are in the circuit. The added resistance of resistor R48 in the input circuit causes the center frequency of the notch to decrease, i.e., shift down. Likewise when the switch S40 in the feedback circuit is open the center frequency of the boost circuit is shifted down. When the switch S42 is closed the center frequency of the notch increases, i.e., shifts up. Likewise when switch S40 is closed in the feedback filter F2 the boost shifts up. As can be seen in the waveform diagrams in FIG. 4D, the notch or cut and the boost preferably shift together between the same center frequencies of about 400 Hz and 900 Hz.

In filters F1 and F2 corresponding elements have similar value. For example, in the notch filter F1, resistor R40 has a value which is about the same as parallel bridging resistor R54 and is large (e.g., 10x) compared to series resistor R50. Capacitor C52 has a large value compared to bridging capacitor C48. The filter F2 is a mirror of the filter F1 in the feedback circuit, hence, the effect due to one circuit is opposite the effect due to the other.

In FIG. 3, the edge and bottom circuit 28 is illustrated as an another example of post distortion control. This circuit employs a feedback loop including capacitor C60 in parallel with series connected resistors R60 and R62. Shunt capacitor C62 bridges resistor R62 which is about five times the value of resistor R60. Potentiometer P60 couples the node between resistors R62 and R60 to ground via series limiting resistor R64. The input circuit includes resistor R66 in series with resistor R70 and voltage divider resistor R72. Bridging capacitor C66 is in parallel with resistor R66, which again is about four times the value of resistor R70. Potentiometer P62 bridges the inverting input 60 and noninverting input 61.

The edge control potentiometer P62, can be rotated clockwise for boost at high frequencies, or rotated counter-clockwise for cut at high frequencies. At high frequencies, capacitor C66 effectively shorts out resistor R66 and capacitor C62 effectively shorts out resistor R62. Capacitor C60 stabilizes the circuit at very high frequencies and keeps RF out of the circuit. If the Edge control potentiometer P62 is rotated full clockwise, the gain of amplifier A5 will be a ratio of resistor R60 plus resistor R62 divided by resistor R68 above the frequency cutoff determined by the value of capacitor C68. If the potentiometer P62 is rotated full counter-clockwise, a voltage-divider consisting of resistors R70 and R68 reduces the gain by the same ratio above the frequency cutoff determined by the value of capacitor C68.

The Bottom control potentiometer P60 can be rotated clockwise for boost at low frequencies, or rotated counter-clockwise for cut at low frequencies. Capacitor C66 and resistor R66 in combination with resistor R72 and the counter-clockwise side of potentiometer P60 make up an input voltage-divider below the frequency determined by the value of capacitor C66. Resistor R62 and capacitor C62 in combination with resistor R64 and the clockwise side of potentiometer P60 create gain equal to the ratio of the sum of resistor R62 plus resistor R64 plus the resistance of potentiometer P60 between its wiper and clockwise terminal, to the sum of potentiometer P62 and the resistance of potentiometer P60 between its wiper and clockwise terminal. This gain only occurs below the cutoff frequency determined by capacitor C62. If the potentiometer P60 is rotated full clockwise, the gain created by resistor R62, capacitor C62, etc. is increased to an amount which will overcome the voltage division created by resistor R66, capacitor C66, etc. Conversely, if the potentiometer P60 is rotated full counter-clockwise the voltage division created by resistor R66, capacitor C66, etc. will overcome the gain of the amplifier A5 created by resistor R62, capacitor C62, etc.

Figure 4F:
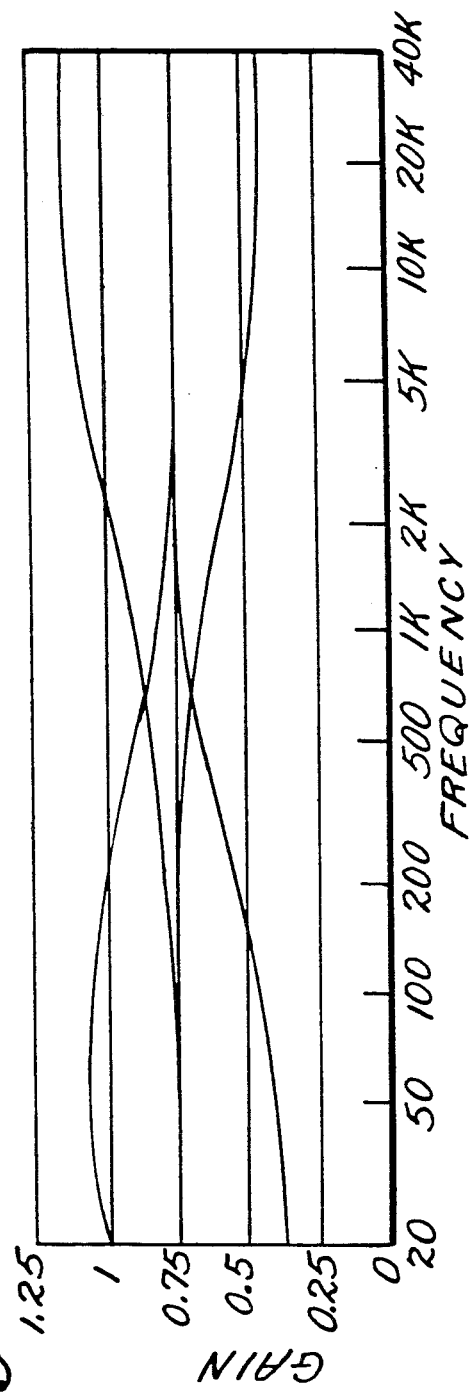

Both the Bottom and Edge circuits result in a gain increase or gain decrease in their respective frequency ranges of about 12 dB. The frequency response of this circuit is illustrated in FIG. 4F.

While there have been described what at present are considered to be preferred embodiments of the invention, it will be readily apparent to those skilled in the art that various changes and modifications may be made therein without departing from the invention. Accordingly, it is intended in the claims which follow to cover all such changes and modifications which fall within the true spirit and scope of the invention.

What is claimed is:

1. Circuitry for selectively amplifying audio signals alternately in clean and lead modes comprising:
    first amplifier means having an output circuit being selectively operative between respective clean and lead modes to produce an output at a selected first nominal gain value greater than unity and corresponding frequency response characteristic in the clean mode and at second nominal gain value greater than unity and corresponding frequency response in the lead ode;
    second amplifier means having an input circuit responsively coupled to the first amplifier means and being selectively operative at a first selected nominal gain value in the lead mode and at unity gain in the clean mode;
    mode switch means for selectively enabling the second amplifier means between the clean mode and the lead mode; and
    selectable gain control means coupled between the output circuit of the first amplifier means, the mode switch means and the input of the second amplifier means said selectable gain control means being operative when selected for reducing the gain produced at the output circuit of the first amplifier means in the lead mode.

2. The circuitry of claim 1 further including brightness control means in circuit with the output circuit of the first amplifier means and the mode switch means and being operative to selectively boost high frequency response of the first amplifier means in the clean mode.

3. The circuitry of claim 2 wherein the first amplifier means has a feedback circuit and a ground circuit and the brightness control means comprises a circuit coupled to the feedback circuit including an impedance and a series connected switch bridging the ground circuit for lowering impedance in said ground circuit to thereby raise the gain of the first amplifier means at high frequencies when the switch is closed.

4. The circuitry of claim 3 wherein the ground circuit has a selected resistance and the impedance bridging the ground circuit has a resistance of about 10% of the ground circuit.

5. The circuitry of claim 4 wherein the ground circuit of the first amplifier means includes a first capacitor for establishing a first frequency response therefor when the switch is open and the bridging circuit includes a second capacitor for establishing a second higher frequency response when the switch is closed.

6. The circuitry of claim 5 wherein said second capacitor in the bridging circuit has a value of about 10% of the value of the first capacitor in the ground circuit.

7. The circuitry of claim 5 wherein the first frequency response of the first amplifier means is flat when the switch is open and the second higher frequency response is increased above about 1 kilohertz.

8. The circuitry of claim 1 wherein the first amplifier means has a feedback circuit including series connected feedback resistors and the mode switch means is coupled to the feedback circuit at a node between said feedback resistors for transferring a portion of the feedback circuit into the output circuit of said first amplifier means to thereby reduce the gain of the first amplifier means when the mode switch means is in the lead mode.

9. The circuitry of claim 1 wherein said second amplifier means has a ground circuit including serially connected resistors and a switch in shunt with at least one of said resistors, said switch for reducing the ground circuit resistance to thereby raise the gain of the second amplifier when the switch is closed.

10. The circuitry of claim 9 wherein the ground circuit of the second amplifier means includes frequency responsive impedance means for establishing a selected low frequency response and the switch raises the low frequency response of the second amplifier means when closed.

11. The circuitry of claim 10 wherein the low frequency response of the second amplifier means is about 50 hertz when the switch is open and is about 800 hertz when the switch is closed.

12. Circuitry for selectively amplifying audio signals in clean and lead modes comprising:
first amplifier means having an output circuit and a feedback circuit, said first amplifier means being operative to produce an output at a first and a second discrete gain and frequency response in the clean mode and at a third discrete gain and frequency response in the lead mode;
second amplifier means having an input responsive to the first amplifier means being operative to produce an output at a selected nominal gain value in the lead mode and for producing unity gain in the clean mode;
mode switch means being operative for selectively enabling the second amplifier means in the lead mode and the clean mode alternately;
switchable element means couple din the feedback circuit and being selectively switchable into the output circuit of the first amplifier means in response to the mode switch means for selectively changing the gain produced at the output circuit of the first amplifier means in the clean mode and the lead mode.

13. The circuitry of claim 12 further comprising:
at least one distortion stage means coupled to the second amplifier means and being operative in the lead mode for producing a clipped distorted output; and
at least one post distortion stage control means for varying the gain and frequency response of the second amplifier in the lead mode.

14. The circuitry of claim 13 wherein the at least one post distortion stage includes circuit means for establishing high and low frequency roll off of the distorted output.

15. The circuitry of claim 14 wherein said circuit means comprises a modified bridged "T" notch filter.

16. The circuitry of claim 15 wherein the filter includes series resistors coupled between an input and output thereof and a pair of capacitors, one having a terminal coupled to a common node between said resistors and the other having a terminal coupled to an output of the filter; and
variable resistor means coupling the other terminals of the capacitor to ground for varying the frequency response of the filter.

17. The circuitry of claim 16 wherein the filter includes a variable resistor bridging the second capacitor for varying the gain thereof.

18. The circuitry of claim 14 wherein the circuit means is passive.

19. The circuitry of claim 14 wherein the circuit means is active.

20. The circuitry of claim 19 wherein the circuit means includes a third amplifier means including first filter means at a noninverted input of said third amplifier means and second filter means coupled between the output of the third amplifier means and an inverting input thereof.

21. The circuitry of claim 20 wherein the first filter means establishes high and low frequency roll off of the distorted output and the second filter means provides an increase in the gain of the third amplifier means near the high and low frequency roll off established by the filter means.

22. The circuitry of claim 21 including means coupled between the first and second filter means for balancing the inverted and noninverted inputs of said third amplifier means.

23. The circuitry of claim 22 wherein the means for balancing comprises a variable impedance.

24. The circuitry of claim 21 wherein said first and second filter means include at least one fixed and one selectively variable impedance branch including a resistor and a switch in shunt therewith, said switch shunting the resistor when closed to thereby lower the impedance of the branch.

25. The circuitry of claim 24 wherein the variable impedance means in the first filter means establishes high and low frequency roll off therefor at a first center frequency when the switch is open and at a second higher center frequency when the switch is closed.

26. The circuitry of claim 24 wherein the variable impedance means in the second filter means establishes a center frequency for boosting the gain of the third amplifier means centered at a first frequency when the switch is open and at a second higher center frequency when the switch is closed.

27. The circuitry of claim 13 wherein said at least one post distortion stage control means includes circuit means for establishing high and low frequency gain control of the distorted output.

28. The circuitry of claim 27 wherein the circuit means comprises a fourth amplifier means including inverted and noninverted inputs and having an input circuit and a feedback circuit and a gain control means coupled between the input and feedback circuits for balancing the amplifier inputs.

29. The circuitry of claim 28 wherein the fourth amplifier has a nominal gain and further includes variable impedance means in the input circuit and the feedback circuit for raising the gain at high frequencies.

30. The circuitry of claim 29 wherein the variable impedance comprises an RC network in the input circuit and feedback circuit.

31. The circuitry of claim 30 wherein the means for balancing the amplifier inputs comprises potentiometer means in the input circuit and the feedback circuit for boosting and cutting the gain; and voltage divider circuit means at the input circuit being variable with frequency response of said RC network.

32. Circuitry for selectively amplifying audio frequencies in clean and lead modes comprising:
a series connection of a first amplifier means for producing an output and a second variable gain amplifier means having an input and being responsively coupled to the first amplifier means for receiving the output thereof, said first amplifier means including a feed back circuit and an output circuit coupled to the input of the second amplifier means; and mode switch means operative between the clean and lead modes coupled to the feed back circuit, the output circuit and the input of the second amplifier means, said second amplifier means operative between a firs variable gain in the lead mode and unity gain in the clean mode, said mode switch means for selectively controlling the feed back circuit and the output circuit of the first amplifier means and the input of the second amplifier means so that a portion of the feed back circuit is selectively coupled into the output circuit of the first amplifier means to produce an output at a first gain when the mode switch means is in the lead mode and at a second gain higher than the first gain when the mode switch means is in the clean mode.

33. The circuitry of claim 32 further comprising distortion circuit means in circuit with the second amplifier and the mode switch means being operable in the lead mode to produce a distorted output audio signal.

34. The circuitry of claim 33 further comprising at least one post distortion circuit operable in the lead mode for varying at least one of gain and frequency response of the distorted audio signal.

35. The circuitry of claim 32 wherein said first amplifier means includes means for selectively brightening high frequency response thereof in the clean mode.

36. The circuitry of claim 32 wherein said second amplifier means includes means for selectively reducing low frequency response thereof in the lead mode.

* * * * *